United States Patent [19]

Morimoto

[11] 4,147,573
[45] Apr. 3, 1979

[54] METHOD OF DEPOSITING III-V COMPOUNDS ON GROUP IV ELEMENT WAFERS BY THE CLUSTER ION TECHNIQUE

[75] Inventor: Kiyoshi Morimoto, Mobara, Japan

[73] Assignee: Futaba Denshi Kogyo K. K., Chiba, Japan

[21] Appl. No.: 886,893

[22] Filed: Mar. 15, 1978

[30] Foreign Application Priority Data

Apr. 5, 1977 [JP] Japan .................................. 52-38039

[51] Int. Cl.² ................. H01L 21/203; H01L 21/26; C23C 15/00
[52] U.S. Cl. ..................................... 148/175; 148/1.5; 156/610; 156/643; 204/192 N; 204/192 S; 204/192 EC; 204/298
[58] Field of Search ................. 148/175, 1.5; 204/192 N, 192 S, 192 EC, 298; 156/610, 643; 427/38, 39

[56] References Cited

U.S. PATENT DOCUMENTS

| | | | |
|---|---|---|---|
| 3,607,699 | 9/1971 | Sosniak | 204/192 |
| 3,615,931 | 10/1971 | Arthur | 148/175 |
| 3,912,826 | 10/1975 | Kennedy | 427/38 X |
| 3,974,059 | 8/1976 | Murayama | 204/298 |
| 4,013,533 | 3/1977 | Cohen-Solal et al. | 204/192 S |
| 4,066,527 | 1/1978 | Takagi et al. | 204/192 N |

OTHER PUBLICATIONS

Takagi et al., "Ionized-Cluster Beam Deposition", J. Vac. Sci. Technol., vol. 12, No. 6, Nov./Dec. 1975, pp. 1128-1134.

Primary Examiner—L. Dewayne Rutledge
Assistant Examiner—W. G. Saba
Attorney, Agent, or Firm—Oblon, Fisher, Spivak, McClelland & Maier

[57] ABSTRACT

A method of producing a compound semiconductor wafer which comprises cleaning the surface of a monocrystalline substrate of a group-IV element semiconductor by ion beam etching in a high vacuum, separately evaporating materials consisting of or containing the component elements of a desired compound semiconductor, jetting the vapors of the component elements into the high vacuum region to form clusters, ionizing the clusters to form cluster ions, and accelerating the cluster ions to make them impinge on the substrate so that an epitaxial layer of the desired compound semiconductor may be formed on the substrate.

3 Claims, 1 Drawing Figure

METHOD OF DEPOSITING III-V COMPOUNDS ON GROUP IV ELEMENT WAFERS BY THE CLUSTER ION TECHNIQUE

BACKGROUND OF THE INVENTION

1. Field of the Invention

The present invention relates to a method of producing a compound semiconductor wafer by making a compound semiconductor epitaxially grow on a monocrystalline substrate of a group-IV element semiconductor.

2. Description of the Prior Art

In the case of a compound semiconductor, the band gap or energy gap thereof can be optionally changed by modifying the kinds and proportions of the component elements thereof. Accordingly, for instance, a light-emitting diode can be formed using such a compound semiconductor so that it may emit any wave-length light in the range from red light to green light determined by the composition of the compound semiconductor used. Some kinds of compound semiconductors which are very high electron mobility are useful as ultra-high frequency devices, coming into the limelight recently.

The compound semiconductor mentioned above, however, has disadvantages in that its crystal production process requires complicated and highly sophisticated techniques and its material is expensive. As a result, the monocrystalline wafer thereof produced is very expensive, and also a large size wafer thereof is difficult to obtain owing to the above-mentioned limitations on the production techniques.

For instance, in the case of a light-emitting diode of gallium phosphide (GaP) which emits green light, it is commonly produced by forming an epitaxial layer of GaP on a GaP or gallium arsenide (GaAs) substrate by vapor-phase or liquid-phase epitaxy and then by forming a P-N junction in this epitaxial layer. However, the above-mentioned GaP or GaAS substrate is very expensive and cannot be made large in size, and therefore the product is also very expensive. In addition, formation of the epitaxial layer by the above process usually requires to maintain the substrate at a very high temperature, normally at about 900° C. or more. However, such a high temperature of the substrate causes decomposition of, for instance, a III-V compound semiconductor and escape of a group-V element thereof, and therefore the compound produced becomes stoichimetrically incorrect. Because of this reason, it is required to provide, for instance, means for confining the group-V element in a high pressure region so as to prevent escape thereof, and consequently the production process of the compound semiconductor becomes very complicated.

Meanwhile, for the purpose of obtaining an inexpensive and large-size GaP wafer, efforts are being made to use, as a substrate, a group-IV element semiconductor, for instance, silicon (Si) or germanium (Ge) which can be easily made inexpensive, large in size and high in quality. However, in this case, difficulties are encountered in forming a high-quality crystalline layer on a substrate because the lattice constant, thermal expansion coefficient and the like of the substrate are different from those of an epitaxial growth of, for instance, GaP. In addition, the epitaxial growth layer formed on the substrate tends to mechanically peel off the substrate.

Besides, in the conventional method, it is required to heat the substrate to a high temperature during the epitaxial growth process as mentioned above, and therefore silicon or germanium in the substrate tends to diffuse in the epitaxial layer thereby deteriorating the electric characteristics thereof.

BRIEF SUMMARY OF THE INVENTION

The present invention has been made in consideration of the above-mentioned disadvantages of the prior art.

Therefore, it is an object of the present invention to provide a method of producing a compound semiconductor wafer, which can form an epitaxial growth high in crystal quality of a compound semiconductor on a substrate of a group-IV element semiconductor.

It is another object of the present invention to provide a method of producing a compound semiconductor, which can produce a compound semiconductor wafer very inexpensive, large in size and high in quality.

It is still another object of the present invention to provide a method of producing a compound semiconductor wafer, which can easily produce a compound semiconductor wafer having a predetermined stoichiometric composition.

It is a further object of the present invention to provide a method of producing a compound semiconductor wafer, which can simplify the production processes and decrease the production time.

According to the present invention, there is provided a method of producing a compound semiconductor wafer using a monocrystalline substrate of a group-IV element semiconductor, which comprises cleaning the surface of the substrate by the so-called ion-beam etching which bombards the surface of the substrate with ion beams of an inert gas, heating and vaporizing the component elements of a compound semiconductor separately in a plurality of crucibles to produce vapors thereof, jetting these vapors into a high vacuum region having a pressure of 1/100 or less the pressure of the above vapors to form atomic groups or clusters of the component elements, ionizing the clusters to produce ionized clusters, and giving kinetic energy to the ionized clusters by an electric field to make them impinge on the cleaned surface of the substrate so that the ionized clusters may be deposited on the substrate together with non-ionized clusters.

DETAILED DESCRIPTION OF THE PREFERRED EMBODIMENTS

Figure 1:
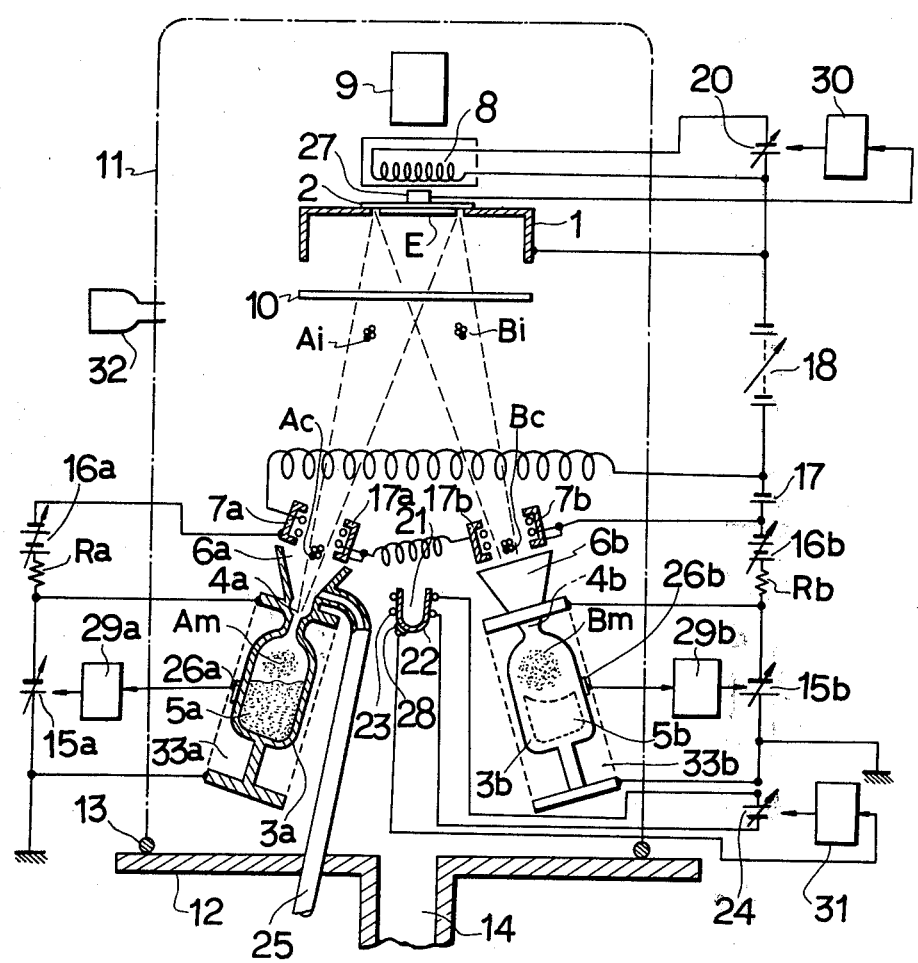
FIG. 1 schematically shows, as an example, the construction of an apparatus for use in performing the method of producing a compound semiconductor wafer according to one preferred embodiment of the present invention.

Now, the present invention will be hereinafter described with reference to the accompanying drawing.

Reference numeral 1 designates a substrate holder for holding a monocrystalline substrate 2 of a group IV element, for instance, silicon (Si). Reference numerals 3a and 3b designate enclosed crucibles for containing vaporizing materials 5a and 5b consisting of or containing the component elements of a desired compound semiconductor which is made to epitaxially grow respectively. The above crucibles 3a and 3b have small-diameter injection nozzles 4a and 4b respectively. The crucibles 3a and 3b are used for heating and vaporizing the materials 5a and 5b placed therein. For this purpose, the crucibles 3a and 3b may be heated by, for instance, direct resistance heating in which large current is made to flow directly through the crucibles 3a and 3b made of resistive material for heating, resistance heating in which heaters provided around the crucibles 3a and 3b are energized for heating, electron impact heating in which the crucibles are bombarded with electrons for heating, or high-frequency induction heating in which the crucibles 3a and 3b or the vaporizing materials 5a and 5b are heated by high-frequency induction.

Reference numerals 6a and 6b designate ionization chambers provided adjacent to the crucibles 3a and 3b respectively for ionizing clusters to be later described. Reference numerals 7a and 7b designate filaments for emitting thermions when heated respectively. Reference numeral 8 designates a heater for heating the substrate 2 to a predetermined temperature. Reference numeral 9 designates a film thickness sensor for measuring the thickness of a compound semiconductor film epitaxially grown on the substrate 2. Reference numeral 10 designates a shutter for shielding the substrate 2 from exposure to cluster ions as occasion demands. Reference numeral 11 designates a bell jar mounted airtightly on a base 12 through an O-ring 13, and reference numeral 14 designates an exhaust hole for evacuating the foregoing bell jar 11 to a high vacuum.

Reference numerals 15a and 15b designate power supplies for supplying large current to the crucibles 3a and 3b for heating respectively. Reference numerals 16a and 16b designate power supplies for producing electric fields between the crucible 3a and the electrode member 17a of the thermion-emitting filament 7a and between the crucible 3b and the electrode member 17b of the thermion-emitting filament 7b, respectively. The above electric fields accelerate electron currents for ionization. Ra and Rb designate resistors for protection against overcurrent respectively. Reference numeral 17 designates a power supply for energizing thermion-emitting filaments 7a and 7b, and reference numeral 18 designates an ion-accelerating power supply for providing an electric field between the electrode members 17a and 17b and the substrate holder 1 so that the electric field may accelerate cluster ions to be later described. If the substrate holder 1 is made of insulating material or if the use of the substrate holder 1 as an electrode is improper, the ion-accelerating power supply 18 may be provided between the electrode members 17a and 17b and an electrode provided at a proper position between the substrate holder 1 and the ionization chambers 6a and 6b.

Reference numeral 20 designates a power supply for energizing the heater 8 for heating the substrate 2. A crucible 22 is provided at a suitable position in the bell jar 11 for vaporizing a dopant or donor impurity 21 placed therein. The dopant 21 is used for controlling the conduction type of a compound semiconductor film epitaxially grown on the substrate 2. Reference numeral 23 designates a heater for heating the crucible 22, and the reference numeral 24 designates a power supply for energizing the heater 23.

Reference numeral 25 designates a gas inlet pipe for introducing inert gas, for instance, argon for use in ion beam etching which cleans the surface of the substrate 2 as a preparatory treatment of the substrate, and for introducing nitrogen or oxygen gas for forming radiative recombination centers together with the dopant 21 when, for instance, wafers are to be produced for the production of light-emitting diodes of GaP.

Reference numerals 26a and 26b designate temperature sensors such as thermocouples provided on the outside surfaces of the walls of the crucibles 3a and 3b for measuring the temperatures of the crucibles 3a and 3b respectively. Reference numerals 27 and 28 designate temperature sensors provided on the substrate 2 and the crucible 22 for measuring the temperatures thereof respectively. The outputs of the above-mentioned temperature sensors 26a and 26b are fed to temperature regulators 29a and 29b respectively, which control the outputs of the crucible-heating power supplies 15a and 15b according to the deviations of the measured temperatures from the set temperatures so that the crucibles 3a and 3b may be kept at the set temperatures. Similarly, the outputs of the temperature sensors 27 and 28 are fed to temperature regulators 30 and 31 respectively, which control the outputs of the power supplies 20 and 24 so that the temperatures of the substrate 2 and crucible 22 may be kept at set values.

Reference numeral 32 designates a vacuum gauge of, for instance, the ionization type for measuring the degree of vacuum inside the bell jar 11. The above-mentioned crucibles 3a and 3b are provided with jackets 33a and 33b for cooling and thermal shielding so as to correctly control the temperatures of the crucibles 3a and 3b and to minimize the influence thereof on other parts.

With the above-mentioned apparatus, the method of producing a compound semiconductor wafer according to the present invention is performed as follows:

First, the monocrystalline substrate 2 of a group-IV element semiconductor, for instance, silicon or germanium is mounted on the substrate holder 1. The vaporizing materials 5a and 5b composed of or containing the component elements of a compound semiconductor to be made to epitaxially grow on the substrate 2 are placed in the crucibles 3a and 3b respectively. When, for instance, a III-V compound semiconductor is to be produced, gallium or indium is placed in the crucible 3a, and phosphorus or arsenic is placed in the crucible 3b. In addition, the dopant 21 for use in determining the conduction type of a compound semiconductor film to be made to epitaxially grow on the substrate 2 is placed in the crucible 22. If the substrate 2 is of N-type, the semiconductor grown on the substrate 2 will be also of N-type. Therefore, when a III-V compound semiconductor is to be produced, as for example, sulphur or selenium acting as doners in the III-V compound semiconductor is placed in the crucible 22 as a dopant. Then, the bell jar 11 is evacuated by an exhausting system (not shown) to a high vacuum having a pressure of $10^{-2}$ Torr or less, preferably $10^{-4}$ or less.

Then, a little amount of an inert gas, for instance, argon is introduced into the ionization chamber 6a so that the vacuum inside the bell jar 11 may reach about 1 to $10^{-3}$ Torr, if, for instance, the vacuum inside the bell jar 11 is originally about $10^{-4}$ Torr. Then, the filament 7a is heated or energized by the power supply 17 to emit thermions. Simultaneously, electron current flowing from the filament 7a to the ionization chamber 6a is formed by the action of the power supply 16a, ionizing the inert gas introduced in the ionization chamber 6a. In this case, an increase in the amount of the inert gas introduced in the ionization chamber 6a causes glow discharge between the filament 7a and the ionization chamber 6a to occur and thereby the ionization efficiency of the inert gas introduced is remarkably improved. On the other hand, the occurrence of the above-mentioned glow discharge causes a large current to flow between the filament 7a and the ionization chamber 6a. However, the above current is limited by the resistor Ra, and therefore it has not adverse influence on the filament 7a, ionization chamber 6a and the power supply 16a.

When the shutter 10 is then opened, the ionized inert gas is given kinetic energy and accelerated toward the substrate 2 by the action of the ion-accelerating power supply 18 provided between the filament 7a and the substrate holder 1, and thus the surface of the substrate 2 is bombarded with ions beams, being cleaned by etching. In this case, the time required for etching is preferably about 10 to 30 minutes though it depends upon the ionization current for the inert gas, the voltage of the ion-accelerating power supply 18, and so on.

In the above-mentioned process for cleaning the surface of the substrate 2 by ion beam etching, if there is the possibility of occurring any deformation or the like to the substrate 2, it is usual practice to close the shutter 10 and energize the heater 8 by the power supply 20 to heat the substrate 2 to a temperature of 500° C. to 1,000° C. for annealing or relieving the deformation, etc.

Then the inert gas, for instance, argon introduced in the bell jar 11 during the previous process is evacuated therefrom through the exhaust hole 14 so that the inside of the bell jar 11 may regain its original vacuum having a pressure of $10^{-2}$ Torr or less, preferably $10^{-4}$ Torr or less.

Then the crucibles 3a and 3b are energized by the crucible-heating power supplies 15a and 15b to heat the vaporizing materials 5a and 5b placed therein respectively.

If the component elements placed in the crucibles 3a and 3b are, for instance, gallium and phosphorus respectively, it is a preferable practice to heat the former to about 1,370° C. and the latter to about 310° C. and to keep the vapor pressure of phosphorus in the crucible 3b about 10 times as large as that of gallium in the crucible 3a so that the amount of phosphorus re-vaporized from the surface of the substrate may be compensated.

The temperatures of the crucibles 3a and 3b are detected by the temperature sensors 26a and 26b respectively. The outputs of the crucibles 3a and 3b are fed to the temperature regulators 29a and 29b respectively, which control the outputs of the crucible-heating power supplies 15a and 15b according to the deviations of the measured values from the set values respectively, so that the temperatures of the crucibles 3a and 3b may be kept at predetermined values independent of each other. Therefore, the vapor pressures of the vaporizing materials 5a and 5b are automatically controlled so that they may be kept at predetermined values respectively.

Then, the vapors Am and Bm of the vaporizing materials 5a and 5b produced in the crucibles 3a and 3b respectively, are jetted through the injection nozzles 4a and 4b into the ionization chambers 6a and 6b kept at high vacuums having pressures of 1/100 or less of those of the vapors Am and Bm respectively. When jetted, the vapors Am and Bm are supercooled due to the adiabatic expansion thereof thereby forming clusters Ac and Bc respectively. The clusters Ac and Bc are atomic groups each consisting normally of about 100 to 2,000 atoms loosely bonded together by van del Waals forces. In this case, all the jetted vapors Am and Bm are not necessarily formed into clusters Ac and Bc. Strictly speaking, molecular or atomic elements are present, but such elements has no influence on the operations and effects of the present invention.

The clusters Ac and Bc thus formed advance toward the substrate 2 through the ionization chambers 6a and 6b in the form of beams respectively under the influence of the kinetic energy and directivity given thereto when jetted. Meanwhile, the filaments 7a and 7b are energized by the power supplies 17 to emit thermions, which are formed, by the action of the power supplies 16a and 16b, into electron currents flowing from the filaments 7a and 7b to the ionization chambers 6a and 6b where the clusters Ac and Bc are passing respectively. Thus, the clusters Ac and Bc are bombarded with the above electron currents respectively. If at least one of the atoms of one cluster Ac or Bc is ionized, the cluster is converted into a cluster ion, thus the clusters Ac and Bc are converted into cluster ions Ai and Bi respectively.

Accordingly, if the shutter 10 is kept open, the cluster ions Ai and Bi are accelerated by an electric field formed by the ion-accelerating power supply 18 toward the substrate 2 while being given large kinetic energy. Thus, the cluster ions Ai and Bi are made to impinge on the substrate 2 together with the neutral clusters Ac and Bc not ionized in the ionization chambers 6a and 6b and advancing toward the substrate 2 under the influence of the large kinetic energy given thereto when jetted respectively. In this case, the substrate 2 is kept heated at a temperature required for forming an epitaxial growth of a desired compound semiconductor on the substrate 2, for instance, at a temperature between 500° C. and 600° C. by the heater 8.

The kinetic energy of the cluster ions Ai and Bi and the clusters Ac and Bc impinging on the substrate 2 is partially converted into sputtering energy, heat energy, etc. In the initial stage of this process, the surface of the substrate 2 is subjected to sputtering and thereby atomic particles thereof are re-deposited on the substrate 2 together with the cluster ions Ai and Bi and the clusters Ac and Bc impinging thereon to form a so-called intermediate layer so that the misfit between the substrate 2 and the epitaxial layer may be minimized.

The above effects make it possible to form a high-quality epitaxial growth on a substrate different in lattice constant and thermal expansion coefficient therefrom, which is difficult to achieve by conventional techniques.

Besides, the heat energy converted from the kinetic energy of the clusters and cluster ions locally heats the substrate 2 so that the epitaxial temperature may be effectively maintained. In addition, the cluster ions Ai and Bi and the clusters Ac and Bc are decomposed into atomic particles by the kinetic energy they have when they impinge on the surface of the substrate 2. The above atomic particles have the so-called migration effect in which they roll on the surface of the substrate to facilitate film formation. Thus, the component elements present in the form of the cluster ions Ai and Bi and clusters Ac and Bc are chemically combined together to form a high-quality epitaxial layer E of a compound semiconductor, for instance, gallium phosphide (GaP) excellent in crystal quality and high in bonding strength with respect to the substrate 2 and between the atoms of itself.

In short, the sputtering effect produced by the cluster ions Ai and Bi and clusters Ac and Bc to form an excellent depositing surface and the surface migration effect produced by the same cooperate to form the epitaxial layer E of the desired compound semiconductor excellent in crystal quality and high in bonding strength at a substrate temperature of as low as, for instance, about 600° C.

Moreover, in this preferred embodiment, the pressures of the vapors of the vaporizing materials 5a and 5b are separately controlled by the respective crucible-heating power supplies 15a and 15b so that the amounts of the vapors generated may be held at predetermined values respectively. In addition, the output of the above-mentioned ion-accelerating power supply 18 can be optionally changed. Thus, by properly setting the voltages of these power supplies, the epitaxial layer of a compound semiconductor produced can be given a predetermined stoichiometric composition.

In the process for forming an epitaxial layer by the action of the clusters Ac and Bc and cluster ions Ai and Bi, if the heater 23 is energized by the power supply 24 and the dopant 21 or doner impurity placed in the crucible 22 is heated at a predetermined temperature set by the temperature regulator 31 so that it is vaporized at a predetermined vapor pressure, the vapor of the dopant 21, which has reached the surface of the substrate 2 together with the cluster ions Ai and Bi and clusters Ac and Bc, diffuses into the epitaxial layer E thereby giving it a predetermined amount of impurity and N-type conductivity.

In this case, if the temperature of the crucible 22 is changed stepwise or continuously, the impurity concentration in the epitaxial layer E can be changed stepwise or continuously.

In addition, if a gas, for instance, nitrogen or oxygen, which contributes to formation of radiative recombination centers together with the dopant 21, is introduced into the bell jar 11 through the gas inlet pipe 25, radiative recombination centers for emitting green or red light can be formed in the epitaxial layer E.

In this manner, the epitaxial layer E of a compound semiconductor having a predetermined conduction type can be formed on the substrate 2 of a group-IV element semiconductor.

If a P-N junction is to be formed, the dopant 21 in the crucible 22 is replaced by a dopant having a conduction type opposite to that of the epitaxial layer E, for instance, a dopant which forms acceptors in the compound semiconductor of the layer E. Thus, a P-N junction can be formed by repeating the above-mentioned process.

A P-N junction may be also formed in the following manner: Without energizing the crucibles 3a and 3b, only the crucible 22 is heated to make the vapor of the dopant 21 reach the epitaxial layer E, and simultaneously the substrate 2 is heated to a predetermined temperature. Thus, for instance, the dopant 21 for forming acceptors is introduced into the N-type epitaxial layer E by thermal diffusion to form a P-N junction.

If the surface of the epitaxial layer having a P-N junction formed in the above-mentioned manner and the rear surface of the substrate 2 are provided with electrodes formed in ohmic contact therewith by, for instance, vacuum deposition and annealing and then the product is taken out of the bell jar 11 and is subjected to scribing, a semiconductor chip for use in, for instance, a light-emitting diode can be obtained. If the above semiconductor chip is mounted on a lead frame or a predetermined base and is sealed in a casing, a light-emitting diode lamp or a light-emitting diode display device can be produced.

It is as a matter of course that a monolithic display device can be easily formed by the use of conventional processes.

It will be apparent from the foregoing description that the method of producing a semiconductor wafer according to the present invention comprises etching the surface of the substrate of a group-IV element semiconductor by ion beams of an inert gas, for instance, argon to remove impurities having adverse influence on epitaxial growth and clean the crystal-growing surface, and forming beams of the clusters and cluster ions of the component elements of the desired compound so that the above beams may impinge on the substrate surface to form an epitaxial growth.

Accordingly, the present invention has the following various advantages and effects:

The surface of the substrate on which a monocrystalline growth is to be formed is reliably cleaned. Cluster beams has various effects peculiar thereto such as formation of an excellent depositing surface for the epitaxial layer and the so-called surface migration effect. The above features and effects make it possible to form an epitaxial growth of a compound semiconductor high in crystal quality on the substrate of a group-IV element semiconductor, which has been heretofore regarded as impossible.

The method of the present invention uses the substrate of a group-IV element semiconductor that can be easily made inexpensive, large in size and high in quality. Thus the epitaxial layer of a compound semiconductor can be formed on the surface of the substrate of the above-mentioned kind. Accordingly, the product of the present invention is far lower in cost than that of the prior art. Hence, the present invention can provide a compound semiconductor wafer extremely inexpensive.

According to the present invention, the epitaxial layer can be made to grow at a temperature lower than that adopted in the conventional liquid phase epitaxy. Therefore, impurities scarecely diffuse into the epitaxial layer from the substrate and, as a result, the epitaxial layer can be made very high in quality.

The component elements of a compound are separately placed in the crucibles and vaporized therein respectively, so that clusters or cluster ions may be formed. Therefore, the composition of the product can be easily controlled and, as a result, an epitaxial layer of a compound semiconductor having a predetermined stoichimetric compound can be easily obtained.

The method of the present invention can be performed continuously in one bell jar from the process for cleaning the surface of the substrate to the processes for P-N junction formation and electrode mounting. Therefore, there are various effects on production such as simplification of the production processes and shortening of the operation time.

Obviously many modifications and variations of the present invention are possible in the light of the above teachings. It is therefore to be understood that within the scope of the appended claims the invention may be practiced otherwise than as specifically described herein.

What is claimed as new and desired to be secured by Letters Patent of the United States is:

1. A method of producing a compound semiconductor wafer which comprises cleaning the surface of a monocrystalline substrate of a group-IV element semiconductor by inert-gas ion beam etching, said substrate being held in a high vacuum atmosphere, separately evaporating vaporizing-materials consisting of or containing the component elements of a desired III-V compound semiconductor to produce vapors of said component elements, jetting said vapors into said high vacuum region to form clusters of said component elements, ionizing said clusters to form cluster ions, and giving kinetic energy to said cluster ions by an electricfield to make them impinge on the surface of said substrate so that an epitaxial layer of said desired compound semiconductor is formed on the surface of said substrate.

2. A method of producing a compound semiconductor wafer which comprises cleaning the surface of a monocrystalline substrate of a group-IV element semiconductor by inert-gas ion beam etching, said substrate being held in a high vacuum atmosphere, separately evaporating vaporizing-materials consisting of or containing the component elements of a desired III-V compound semiconductor to produce vapors of said component elements, jetting said vapors into said high vacuum region to form clusters of said component elements, vaporizing an impurity material for determining the conduction type of said desired compound semiconductor, ionizing said clusters to form cluster ions, accelerating said cluster ions while giving kinetic energy thereto by an electric field to deposit them on the surface of said substrate together with the vapor of said impurity material so that an epitaxial layer of said desired compound semiconductor having a predetermined conduction type is grown on the surface of said substrate.

3. A method of producing a compound semiconductor wafer which comprises cleaning the surface of a monocrystalline substrate of a group-IV element semiconductor by inert-gas ion beam etching, said substrate being held in a high vacuum atmosphere, separately evaporating vaporizing-materials consisting of or containing the component elements of a first desired III-V compound semiconductor to produce vapors of said component elements, jetting said vapors into said high vacuum region to form clusters of said component elements, vaporizing an impurity material for determining the conduction type of said desired compound semiconductor, ionizing said clusters to form cluster ions, accelerating said cluster ions while giving kinetic energy thereto by an electric field to deposit them on the surface of said substrate together with the vapor of said impurity material so that an epitaxial layer of said desired compound semiconductor having a predetermined conduction type is grown on the surface of said substrate, and forming an epitaxial layer of a second desired compound semiconductor on said epitaxial layer of said first desired compound semiconductor having said predetermined conduction type, said second desired compound semiconductor having a conduction type opposite to that of said first desired compound semiconductor so that a P-N junction is formed therebetween.

* * * * *